United States Patent [19]

Chien et al.

[11] Patent Number: 5,328,867
[45] Date of Patent: Jul. 12, 1994

[54] PEROXIDE CLEAN BEFORE BURIED CONTACT POLYSILICON DEPOSITION

[75] Inventors: Sun-Chieh Chien, Taipei; Yu-Ju Liu, Hsin-Chu City, both of Taiwan

[73] Assignee: United Microelectronics Corporation, Hsinchu, Taiwan

[21] Appl. No.: 57,881

[22] Filed: May 7, 1993

[51] Int. Cl.$^5$ .............................................. H01L 21/44
[52] U.S. Cl. .................... 437/191; 437/228; 437/238; 148/DIG. 17; 148/DIG. 118
[58] Field of Search ............................. 437/191, 228; 148/DIG. 17; 134/902

[56] References Cited

U.S. PATENT DOCUMENTS 4,863,561  9/1989  Freeman et al. ................... 156/643
5,147,499  9/1992  Szwejkowski et al. ............. 156/657

FOREIGN PATENT DOCUMENTS 2-307277  12/1990  Japan .

OTHER PUBLICATIONS

Translation of Ito 2-307277.

*Primary Examiner*—Tom Thomas
*Assistant Examiner*—Michael Trinh
*Attorney, Agent, or Firm*—George O. Saile

[57] ABSTRACT

A method of removing impurities from the surface of an integrated circuit and forming a uniform thin native oxide layer on the same surface of an integrated circuit is described. A hydrofluoric acid solution, followed by a rinse and spin dry, is often used to remove gate oxide from within an opening etched in a polysilicon layer. The rinsing leaves water spots. Spin drying leaves impurities where water tracks were. An $H_2O_2$ cleaning is performed to remove the water spots. After the cleaning, a uniform thin layer of native oxide is formed on the surface of the silicon substrate. A second layer of polysilicon is deposited over this first thin native oxide layer and doped with an implant dosage chosen so that it will go through the uniform native oxide layer. The substrate is annealed to drive in the buried contact. Processing continues to form polysilicon or silicide gate electrodes. Source and drain regions are formed within the openings to the silicon substrate between the gate electrodes. Spacers are formed on the sidewalls of the gate electrodes. An insulating layer is deposited over the surface of the silicon substrate. Contact openings are etched through the insulating layer to the second polysilicon layer and to the silicon substrate. A metal layer is deposited over the insulating layer and filling the openings to the second polysilicon layer and the silicon substrate. The metal layer is patterned, completing the formation of the buried contacts within the integrated circuit.

31 Claims, 5 Drawing Sheets

PEROXIDE CLEAN BEFORE BURIED CONTACT POLYSILICON DEPOSITION

BACKGROUND OF THE INVENTION (1) Field of the Invention

The invention relates to the fabrication of integrated circuit devices, and more particularly, to a method of removing water spots induced by a hydrofluoric acid etch in the manufacture of integrated circuits.

(2) Description of the Prior Art

Figure 1A:
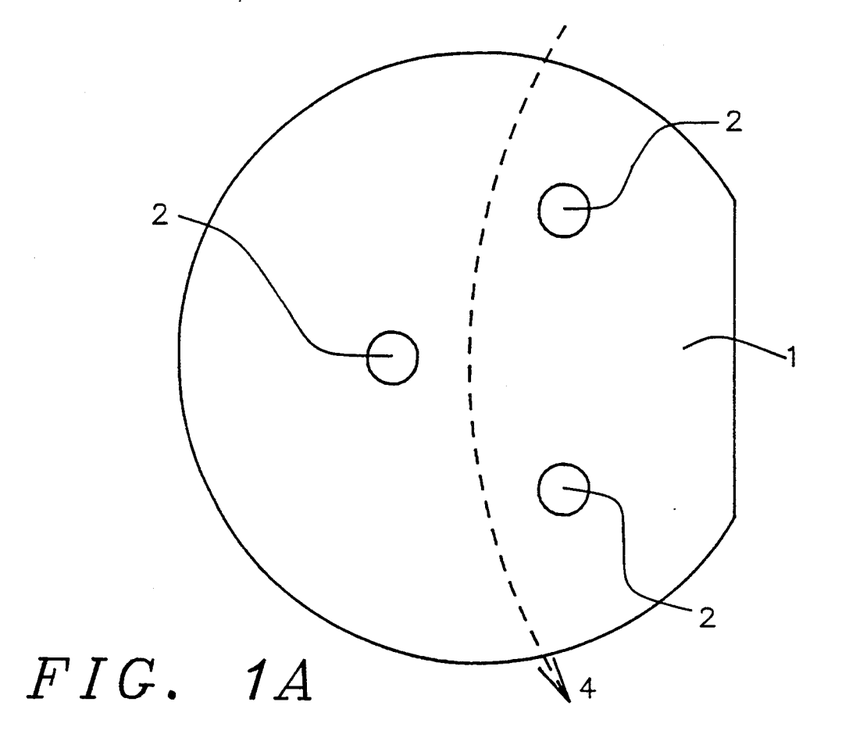
FIGS. 1A and 1B schematically illustrate the water spots and resulting impurities left on the surface of an integrated circuit after the rinsing and drying process.
Figure 1B:
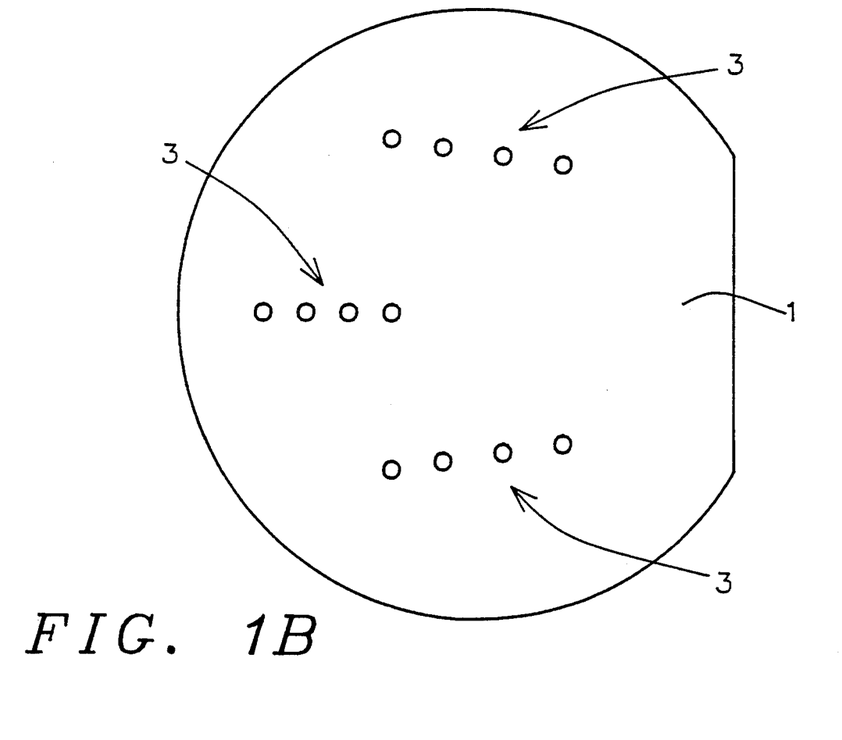

In the manufacture of integrated circuits the presence of tiny impurities on the surface of a wafer may cause failures in devices built upon or under these impurities. Referring to FIG. 1A, there are illustrated droplets of de-ionized water 2 on the surface 1 of a wafer. After a hydrofluoric acid etch a wafer is typically rinsed in de-ionized water. These droplets are formed into water tracks during spin-drying, indicated by arrow 4. Referring to FIG. 1B, the water droplets are spun off in the drying process, but impurities 2 remain on the surface of the wafer 1 in the form of water tracks 3. These impurities contain oxygen and can be seen through a microscope to be on and in the surface of the wafer.

Native oxide layers which are formed when the silicon substrate of an integrated circuit is exposed to the air may also cause problems. Since a native oxide layer is formed in an uncontrolled manner, the thickness of the layer may not be uniform throughout. In particular, in the case of buried contacts, the native oxide layer above a planned buried contact may act as a diffusion barrier when ions are implanted to form the buried contact. It is desirable to control the formation of the native oxide so that its thickness is both uniform and known.

Japanese Patent JA 2-307277 to Ito describes an etching and cleaning process followed by a controlled oxidation of the substrate to produce a uniform thickness oxide layer. This controlled oxidation is a two-hour process.

SUMMARY OF THE INVENTION

A principal object of the present invention is to provide an effective and very manufacturable method of removing impurities caused by water spots from the surface of an integrated circuit.

Another object of the present invention is to provide a method of forming a uniform thin native oxide layer which will not act as a diffusion barrier during the formation of buried contacts.

In accordance with the objects of this invention the method of removing impurities from the surface of an integrated circuit and forming a uniform thin native oxide layer on the same surface of an integrated circuit is achieved. First, a gate oxide layer is formed on a silicon substrate. A first layer of polysilicon is deposited over the gate oxide layer. The first polysilicon layer is patterned to form openings to the gate oxide layer. The gate oxide within the openings is etched away with a hydrofluoric acid solution, followed by a rinse and spin dry. This rinsing leaves water spots. After drying, the water is gone, but impurities remain where the water spots were. An $H_2O_2$ cleaning is performed to remove the water spots. After the cleaning, a uniform thin layer of native oxide is formed on the surface of the silicon substrate. This layer has a uniform thickness of from 10 to 30 Angstroms. A second layer of polysilicon is deposited over this first thin native oxide layer. The second polysilicon layer is doped with an implant dosage chosen so that it will go through the uniform native oxide layer. The substrate is annealed to drive in the buried contact. A second thin layer of native oxide forms on the surface of the second polysilicon layer. This second native oxide layer is etched away and the wafer is rinsed and dried, resulting in the formation of more water spots. A second $H_2O_2$ cleaning removes these water spots and a uniform third thin layer of native oxide is formed on the surface of the second polysilicon layer as a result of the $H_2O_2$ cleaning process. The two polysilicon layers are patterned to form gate electrodes on the surface of the silicon substrate. In an alternative process, before this patterning, the substrate is etched with a hydrofluoric acid vapor to remove the third native oxide layer. A layer of tungsten silicide is deposited on top of the second polysilicon layer. Then this tungsten silicide layer along with the two polysilicon layers are patterned to form gate electrodes. Further processing is identical for the two alternatives. Source and drain regions are formed within the openings to the silicon substrate between the gate electrodes. Spacers are formed on the sidewalls of the gate electrodes. An insulating layer is deposited over the surface of the silicon substrate. Contact openings are etched through the insulating layer to the second polysilicon layer and to the silicon substrate. A metal layer is deposited over the insulating layer and filling the openings to the second polysilicon layer and the silicon substrate. The metal layer is patterned, completing the formation of the buried contacts within the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 2:
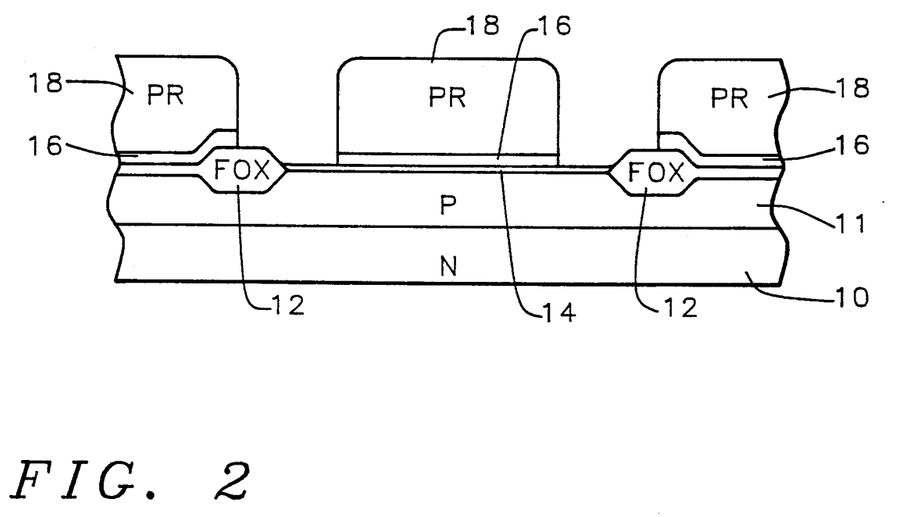
FIGS. 2 through 7 schematically illustrate in cross-sectional representation one preferred embodiment of the present invention.

Referring now more particularly to FIG. 2, there is shown an illustration of a portion of a partially completed CMOS field effect transistor integrated circuit. The semiconductor substrate 10 is preferably composed of silicon having a (100) crystallographic orientation. A p-well 11 has been formed within the n-substrate 10. P-well formation is discussed in *VLSI Technology*, International Edition, by S. M. Sze, McGraw-Hill Book Company, NY, NY, c. 1988 by McGraw-Hill Book Company, pp. 484–487. The first series of steps involves the formation of the dielectric isolation regions for isolating semiconductor surface regions from other such regions in the semiconductor substrate 10. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 12. Then semiconductor devices can be provided in the silicon mesas according to the following processes.

The surface of the silicon substrate 10 is thermally oxidized at a temperature of about 890° to 910° C. for 45 to 55 minutes to form the desired gate oxide 14 thickness of between about 180 to 220 Angstroms. The undoped polysilicon layer 16 is blanket deposited at a temperature of between about 615° to 635° C. for 8 to 12 minutes to a preferred thickness of between about 700 to 900 Angstroms. The layer 16 is patterned using lithography and anisotropic etching techniques as are conventional in the art to provide openings to the gate dielectric layer 14 and FOX surfaces 12. After etching, photoresist layer 18 is removed.

A hydrofluoric acid etch is used to remove the gate dielectric 14 within the openings in the polysilicon layer 16. This etch will also remove the thin native oxide layer (not shown) that forms as a result of the photoresist removal process. A solution of $H_2O$ and HF is used in the concentration 10:1. The wafer is immersed in the solution at about 25° C. for approximately one minute. The wafer is removed from the hydrofluoric acid, rinsed in de-ionized water, and spin-dried. As shown in FIG. 1A, and as described above, water spots 2 appear on the surface 1 of the substrate after the de-ionized water rinse. After the spin-dry, the water is removed, but the water tracks (3 in FIG. 1B) remain.

The $H_2O_2$ cleaning process of the invention is used to remove the water spots from the surface of the wafer. The wafer is immersed in a solution of $NH_4OH + H_2O_2 + H_2O$ in the concentration 5:1:1 at a temperature of between 60° and 80° C. This is followed by a de-ionized water rinse. Then the wafer is immersed in a solution of $HCl + H_2O_2 + H_2O$ in the concentration 6:1:1 at a temperature of between 60° and 80° C. This is followed by another de-ionized water rinse and spin dry.

Figure 3:
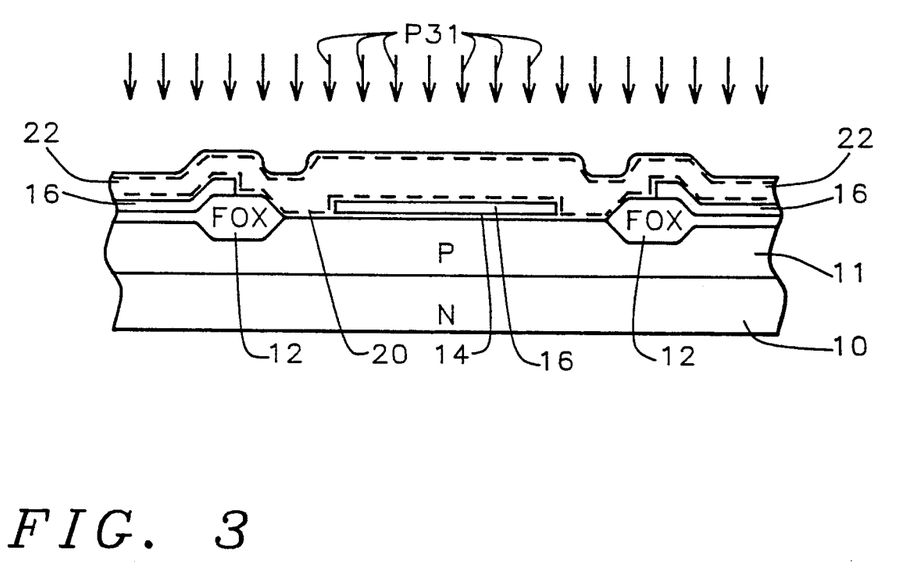

Referring now to FIG. 3, a controlled uniform native oxide layer 20 is formed on all surfaces of the wafer as a result of the cleaning process.

Figure 4:
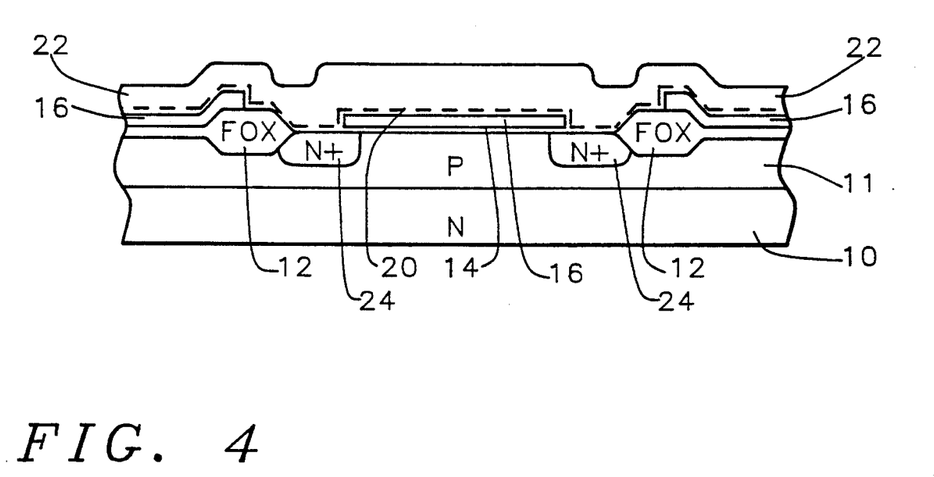

A second layer of polysilicon 22 is blanket deposited over the surface of the wafer at a temperature of between about 615° to 635° C. for 16 to 22 minutes to a preferred thickness of between about 1350 to 1650 Angstroms. The load-in temperature should be as low as 400° C. with a nitrogen purge to avoid growing further unwanted native oxide on the surface of the wafer. The second polysilicon layer is now doped to form the buried contact regions. The dosage concentration is chosen so that it will go through the uniform native oxide layer. The layer 22 is implanted with P31 ions 23 with a dosage of between about 5 E 15 to 1 E 16 atoms/cm$^2$ at an energy of between about 40 to 60 Kev. The wafer is annealed at about 900° C. for a duration of 30 to 60 minutes. This annealing drives in the buried contact regions 24 illustrated in FIG. 4.

A thin layer of native oxide forms on the surface of polysilicon layer 22 as a result of the conducive conditions; that is, heavily doped polysilicon at the high temperature of about 900° C. A hydrofluoric acid etch ms used to remove this native oxide layer. A solution of $H_2O$ and HF is used in the concentration 10:1. The wafer is immersed in the solution at about 25° C. for approximately two minutes. The wafer is removed from the hydrofluoric acid, rinsed in de-ionized water, and spin-dried. As shown in FIG. 1A, and as described above, water spots 2 appear on the surface 1 of the substrate after the de-ionized water rinse. After the spin-dry, the water is removed, but the spots (3 in FIG. 1B) remain.

The $H_2O_2$ cleaning process of the invention is used to remove the water spots from the surface of the wafer. The wafer is immersed in a solution of $NH_4O_2 + H_2O_2 + H_2O$ in the concentration 5:1:1 at a temperature of between 60° and 80° C. This is followed by a de-ionized water rinse. Then the wafer is immersed in a solution of $HCl + H_2O_2 + H_2O$ in the concentration 6:1:1 at a temperature of between about 60° and 80° C. This is followed by another de-ionized water rinse and spin dry.

Figure 5:
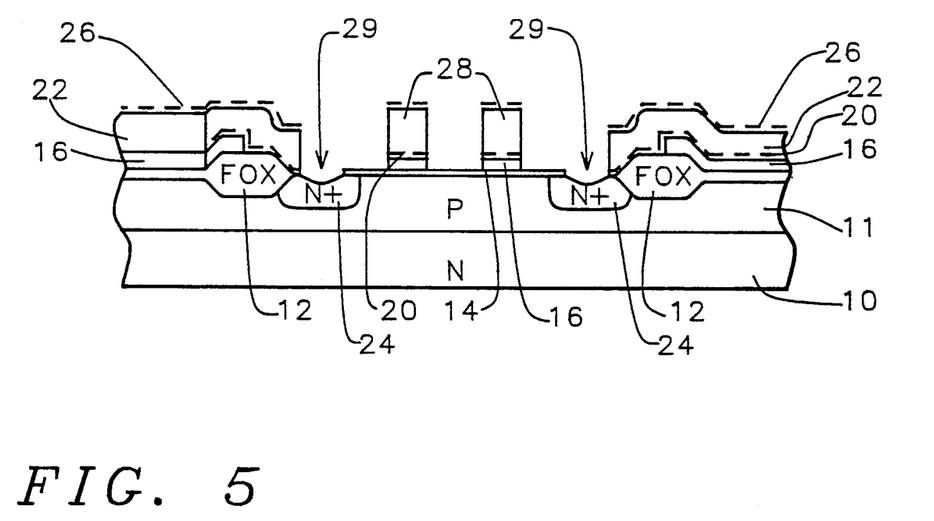

Referring now to FIG. 5, a controlled uniform native oxide layer 26 is formed on all surfaces of the wafer. The polysilicon gate electrodes are now formed using conventional lithographic and etching techniques. Gate electrodes 28 are illustrated in FIG. 5. There is a slight overetching, illustrated by 29, into the substrate at the location of the buried contact regions since these regions are not protected by the gate dielectric 14. If this overetching 29 does not cause crystal damage which will increase leaking, it does not present a problem. The doping 24 is deeper than the overetching.

Figure 6:
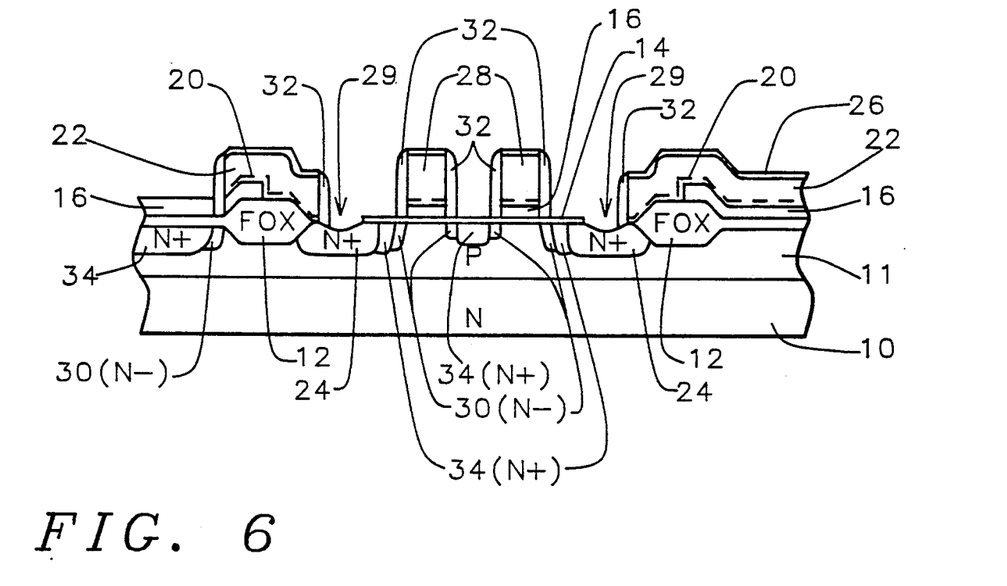

The source/drain structure of the MOS FET may now be formed by the following steps. FIG. 6 shows the ion implantations of N- dopants. Lithographic masks are used to protect the areas not to be subjected to that particular N-ion implantation. The formation of the lithographic masks is done by conventional lithography and etching techniques. The N- lightly doped drain implantation 30 is done with, for example P31 at a dose of between about 2 to 3 E 13 atoms/cm$^2$ and with an energy of between about 45 to 55 Kev. The dielectric spacer 32 is now to be formed followed by the completion of the lightly doped drain source/drain structures. The spacer oxide is blanket deposited using atmospheric pressure chemical vapor deposition (APCVD) to a thickness of between about 2200 to 2700 Angstroms. The spacer oxide is anisotropically etched using conventional reactive ion etching with a fluorine etchant such as $CHF_3$ or $CH_3F$ leaving spacers 32 on the sidewalls of the vertical structures on the wafer. The N+ source/drain implantation is performed next. Conventional lithographic masks are used to protect areas not to be implanted. The N+ implantation is done with, for example, arsenic at a dosage of between about 4.5 to 5.5 E 15 atoms/cm$^2$ and with an energy of between about 70 to 90 Kev.

Figure 7:
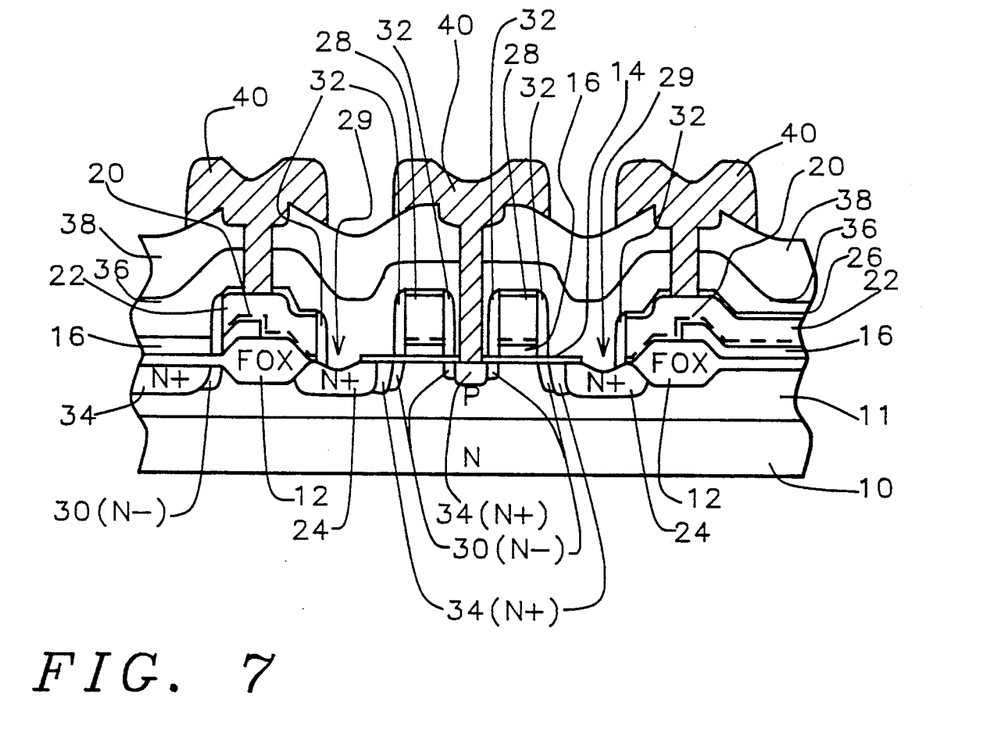

Referring to FIG. 7, an insulating layer is deposited over all surfaces. This layer may be a double layer consisting of a first layer 36 of undoped silicon dioxide deposited to a thickness of about 2000 Angstroms followed by a layer 38 of borophosphosilicate glass (BPSG) deposited to a thickness of about 5700 Angstroms for a combined thickness of between about 8200 to 9200 Angstroms. The insulating layer 36 and 38 is densified at a temperature of about 900° C. in an oxygen/nitrogen atmosphere for about 30 minutes to form a stable BPSG film.

Conventional lithography and etching techniques are used to create openings through the insulating layers 36 and 38 and through native oxide layer 26 and gate dielectric 14 to the underlying second polysilicon layer 22 and silicon substrate, respectively. The etching techniques used are a first wet etch using HF and $NH_4F$ in the concentration 1:20 for a duration of about 9 minutes to partially etch through the insulating layers 36 and 38, followed by a dry etch to etch through the native oxide 26 or gate dielectric 14. The contacts may be completed by the deposition and patterning of a metal layer 40 which may be composed of aluminum, AlSiCu, or the like as shown in FIG. 7.

Figure 8:
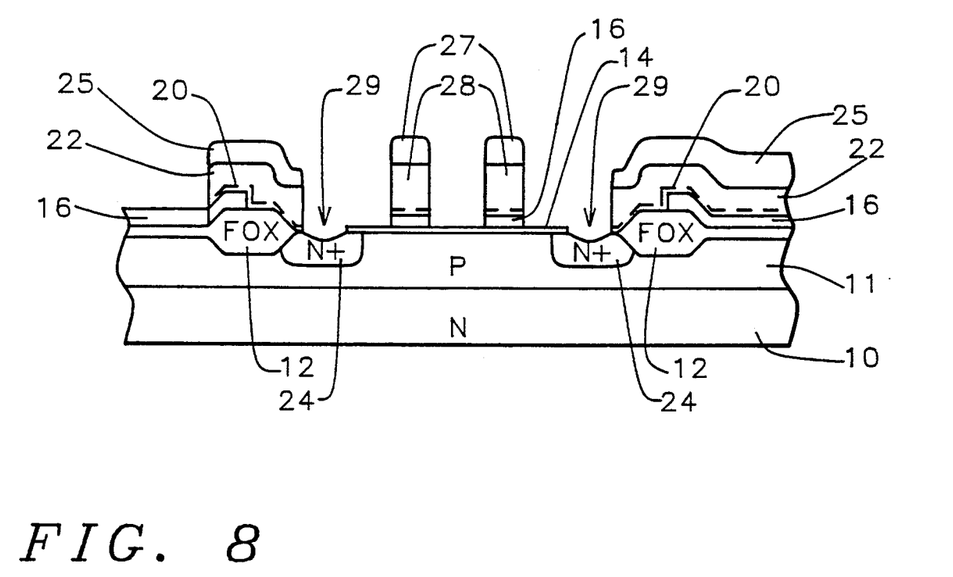
FIGS. 8 and 9 schematically illustrate in cross-sectional representation a second preferred embodiment of the invention.

A second preferred embodiment, in which polycide gate electrodes instead of polysilicon gate electrodes are formed, will now be described. This embodiment is identical to the first embodiment through the steps illustrated by FIGS. 2 through 4. The last steps described for FIG. 4 were the hydrofluoric acid etch to remove the native oxide layer formed on the surface of polysilicon layer 22 followed by the $H_2O_2$ cleaning process of the invention to remove water spots. After the cleaning process, a controlled uniform native oxide layer 26, illustrated in FIG. 5, is formed on all surfaces of the wafer. Referring now to FIG. 8, the second embodiment is described. A vapor hydrofluoric acid etch is used to remove the controlled uniform native oxide layer formed on the surface of the polysilicon layer 22. A layer 25 of tungsten silicide ($WSi_2$) is deposited by low pressure chemical vapor deposition (LPCVD) using tungsten hexafluoride ($WF_6$) and silane ($SiH_4$) as the reactive agents. The tungsten silicide layer 25 is deposited to a thickness of between about 1500 to 2000 Angstroms.

The polycide gate electrodes are now formed using conventional lithographic and etching techniques. Gate electrodes 27 are illustrated in FIG. 8. There is a slight overetching, illustrated by 29, into the substrate at the location of the buried contact regions since these regions are not protected by the gate dielectric 14.

Figure 9:
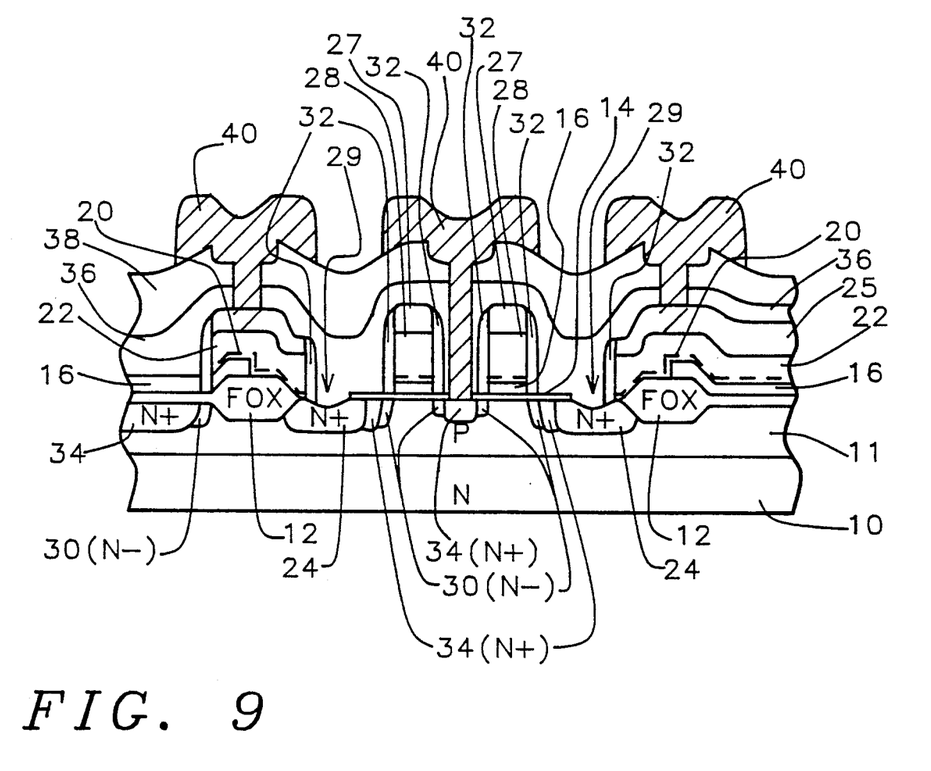

Processing continues as described above for the first embodiment. FIG. 9 illustrates source and drain structures 30 and 34, spacers 32, insulating layers 36 and 38, and metallization layer 40 which completes the contacts of the integrated circuit.

While the invention has been particularly shown and described with reference to the preferred embodiments thereof, it will be understood by those skilled in the art that various changes in form and details may be made without departing from the spirit and scope of the invention. Particularly it should be understood that this invention is not limited to the fabrication of CMOSFET integrated circuits, but can be applied to BICMOS integrated circuits generally. The implant species would of course be reversed if necessary.

What is claimed is:

1. The method of removing water spots from the surface of an integrated circuit comprising:
   providing a thin layer of native oxide on the surface of said integrated circuit;
   etching away said thin native oxide layer;
   rinsing and drying said surface after said etching away of said native oxide layer whereby water spots are formed on the surface of said integrated circuit as a result of said rinsing and drying; and
   $H_2O_2$ cleaning of said surface to remove said water spots whereby a uniform second thin layer of native oxide is formed on the surface of said integrated circuit as a result of said $H_2O_2$ cleaning process.

2. The method of claim 1 wherein said $H_2O_2$ cleaning comprises the steps of immersing said integrated circuit in a solution of $NH_4OH + H_2O_2 + H_2O$ in the concentration 5:1:1 at a temperature of between about 60° to 80° C., followed by a rinsing said integrated circuit with deionized water, immersing said integrated circuit in a solution of $HCl + H_2O_2 + H_2O$ in the concentration 6:1:1 at a temperature of between about 60° to 80° C., rinsing said integrated circuit with de-ionized water for a second time, and spinning said integrated circuit to dry it.

3. The method of claim 1 wherein said $H_2O_2$ cleaning results in the growth of a controlled second native oxide layer having a thickness of between about 10 to 30 Angstroms.

4. The method of fabricating an integrated circuit with buried contacts comprising:
   forming a gate oxide layer on a silicon substrate;
   depositing a first layer of polysilicon over said gate oxide layer;
   patterning said first polysilicon layer to form openings to said gate oxide layer;
   etching away said gate oxide layer within said openings;
   rinsing and drying said silicon substrate after said etching away of said gate oxide layer whereby water spots are formed on the surface of said silicon substrate as a result of said rinsing and drying;
   $H_2O_2$ cleaning of said silicon substrate to remove said water spots whereby a uniform first thin layer of native oxide is formed on the surface of said silicon substrate as a result of said $H_2O_2$ cleaning process;
   depositing a second layer of polysilicon over said first thin native oxide layer;
   doping said second polysilicon layer with a concentration sufficient to penetrate through said uniform first thin native oxide layer to form said buried contact regions in said silicon substrate;
   annealing said silicon substrate to drive said doping concentration into said silicon substrate to form said buried contact regions whereby a second thin layer of native oxide forms on the surface of said second polysilicon layer;
   etching away said second thin native oxide layer;
   rinsing and drying said silicon substrate after said etching away of said second native oxide layer whereby water spots are formed on the surface of said second polysilicon layer as a result of said rinsing and drying;
   $H_2O_2$ cleaning of said silicon substrate to remove said water spots whereby a uniform third thin layer of native oxide is formed on the surface of said second polysilicon layer as a result of said $H_2O_2$ cleaning process;
   patterning said second and first polysilicon layers to form gate electrodes on the surface of said silicon substrate;
   forming source and drain regions within openings to said silicon substrate between said gate electrodes;
   forming spacers on the sidewalls of said gate electrodes;
   depositing an insulating layer over the surface of said silicon substrate;
   etching contact openings through said insulating layer to said second polysilicon layer and to said silicon substrate;
   depositing a metal layer over said insulating layer and filling said openings to said second polysilicon layer and said silicon substrate; and patterning said metal layer to complete said buried contacts within said integrated circuit.

5. The method of claim 4 wherein the thickness of said gate oxide layer is between about 180 to 220 Angstroms.

6. The method of claim 4 wherein said first polysilicon layer is deposited to a thickness of between about 700 to 900 Angstroms.

7. The method of claim 4 wherein said second polysilicon layer is deposited to a thickness of between about 1350 to 1650 Angstroms.

8. The method of claim 4 wherein said second polysilicon layer is doped by ion implantation of phosphorus P31 with a dosage of between about 5 E 15 to 1 E 16 atoms/cm$^2$ and energy of between about 45 to 55 Kev whereby said implant dosage is sufficient to go through said uniform third native oxide layer.

9. The method of claim 4 wherein said etching away of said gate oxide layer is performed by a hydrofluoric acid etch in the concentration 10 H$_2$O: 1 HF.

10. The method of claim 4 wherein said etching away of said second native oxide layer is performed by a hydrofluoric acid etch in the concentration 10 H$_2$O : 1 HF.

11. The method of claim 4 wherein said H$_2$O$_2$ cleaning comprises the steps of immersing said substrate in a solution of NH$_4$OH + H$_2$O$_2$ + H$_2$O in the concentration 5: 1:1 at a temperature of between about 60° to 80° C., followed by rinsing said substrate with de-ionized water, immersing said substrate in a solution of HCl + H$_2$O$_2$ + H$_2$O in the concentration 6:1:1 at a temperature of between about 60° to 80° C., rinsing said substrate with de-ionized water for a second time, and spinning said substrate to dry it.

12. The method of claim 11 wherein said H$_2$O$_2$ cleaning results in the growth of a controlled native oxide layer having a thickness of between about 10 to 30 Angstroms.

13. The method of claim 4 wherein said source and drain regions are formed by an N- implantation of P31 with a dosage of between about 2 to 3 E 13 atoms/cm$^2$ and an energy of between about 45 to 55 Key followed by spacer formation followed by an N+ implantation of Arsenic with a dosage of between about 4.5 to 5.5 E 15 atoms/cm$^2$ and an energy of between about 70 to 90 Kev.

14. The method of claim 4 wherein said insulating layer is formed of a first layer of undoped silicon oxide with a thickness of between about 1800 to 2200 Angstroms and a second layer of borophosphosilicate glass with a thickness of between about 6400 to 7000 Angstroms for a total insulator thickness of between about 8200 to 9200 Angstroms.

15. The method of claim 4 wherein said metal layer is composed of aluminum.

16. The method of claim 4 wherein said metal layer is composed of AlSiCu.

17. The method of fabricating an integrated circuit with buried contacts comprising:

forming a gate oxide layer on a silicon substrate;

depositing a first layer of polysilicon over said gate oxide layer;

patterning said first polysilicon layer to form openings to said gate oxide layer;

etching away said gate oxide layer within said openings;

rinsing and drying said silicon substrate after said etching away of said gate oxide layer whereby water spots are formed on the surface of said silicon substrate as a result of said rinsing and drying;

H$_2$O$_2$ cleaning of said silicon substrate to remove said water spots whereby a uniform first thin layer of native oxide is formed on the surface of said silicon substrate as a result of said H$_2$O$_2$ cleaning process;

depositing a second layer of polysilicon over said first thin native oxide layer;

doping said second polysilicon layer with a concentration sufficient to penetrate through said uniform first thin native oxide layer to form said buried contact regions in said silicon substrate;

annealing said silicon substrate to drive said doping concentration into said silicon substrate to form said buried contact regions whereby a second thin layer of native oxide forms on the surface of said second polysilicon layer;

etching away said second thin native oxide layer;

rinsing and drying said silicon substrate after said etching away of said second native oxide layer whereby water spots are formed on the surface of said second polysilicon layer as a result of said rinsing and drying;

H$_2$O$_2$ cleaning of said silicon substrate to remove said water spots whereby a uniform third thin layer of native oxide is formed on the surface of said second polysilicon layer as a result of said H$_2$O$_2$ cleaning process;

etching said silicon substrate to remove said third native oxide layer;

depositing a layer of tungsten silicide on top of said second polysilicon layer;

patterning said tungsten silicide layer and said second and first polysilicon layers to form gate electrodes on the surface of said silicon substrate;

forming source and drain regions within openings to said silicon substrate between said gate electrodes;

forming spacers on the sidewalls of said gate electrodes;

depositing an insulating layer over the surface of said silicon substrate;

etching contact openings through said insulating layer to said second polysilicon layer and to said silicon substrate;

depositing a metal layer over said insulating layer and filling said openings to said second polysilicon layer and said silicon substrate; and patterning said metal layer to complete said buried contacts within said integrated circuit.

18. The method of claim 17 wherein the thickness of said gate oxide layer is between about 180 to 220 Angstroms.

19. The method of claim 17 wherein said first polysilicon layer is deposited to a thickness of between about 700 to 900 Angstroms.

20. The method of claim 17 wherein said etching away of said gate oxide layer is performed with a hydrofluoric acid etch in the ratio 10 H$_2$O : 1 HF.

21. The method of claim 17 wherein said second polysilicon layer is doped by ion implantation of phosphorus P31 with a dosage of between about 5 E 15 to 1 E 16 atoms/cm$^2$ and energy of between about 45 to 55 Kev whereby said implant dosage is sufficient to go through said uniform third native oxide layer.

22. The method of claim 17 wherein said second polysilicon layer is deposited to a thickness of between about 1350 to 1650 Angstroms.

23. The method of claim 17 wherein said etching away of said second native oxide layer is performed by a hydrofluoric acid etch in the concentration 10 $H_2O$ : 1 HF.

24. The method of claim 17 wherein said $H_2O_2$ cleaning comprises the steps of immersing said substrate in a solution of $NH_4OH + H_2O_2 + H_2O$ in the concentration 5: 1:1 at a temperature of between about 60° to 80° C., followed by a rinsing said substrate with de-ionized water, immersing said substrate in a solution of $HCl + H_2O_2 + H_2O$ in the concentration 6:1:1 at a temperature of between about 60° to 80° C., rinsing said substrate with de-ionized water for a second time, and spinning said substrate to dry it.

25. The method of claim 24 wherein said $H_2O_2$ cleaning results in the growth of a controlled native oxide layer having a thickness of between about 10 to 30 Angstroms.

26. The method of claim 17 wherein said etching to remove said third native oxide layer is a hydrofluoric acid vapor etch.

27. The method of claim 17 wherein said tungsten silicide layer is deposited by low pressure chemical vapor deposition using tungsten hexafluorine and silane ($WF_6/SiH_4$) as the active agents to a thickness of between about 1500 to 2000 Angstroms.

28. The method of claim 17 wherein said source and drain regions are formed by an N-implantation of P31 with a dosage of between about 2 to 3 E 13 atoms/$cm^2$ and an energy of between about 45 to 55 Kev followed by an N+ implantation of Arsenic with a dosage of between about 4.5 to 5.5 E 15 atoms/$cm^2$ and an energy of between about 70 to 90 Kev.

29. The method of claim 17 wherein said insulating layer is formed of a first layer of undoped silicon oxide with a thickness of between about 1800 to 2200 Angstroms and a second layer of phosphosilicate glass with a thickness of between about 6400 to 7000 Angstroms for a total insulator thickness of between about 8200 to 9200 Angstroms.

30. The method of claim 17 wherein said metal layer is composed of aluminum.

31. The method of claim 17 wherein said metal layer is composed of AlSiCu.

* * * * *